(12) United States Patent
Sung et al.

(10) Patent No.: US 8,021,969 B2
(45) Date of Patent: Sep. 20, 2011

(54) SEMICONDUCTOR DEVICE AND METHOD FOR FABRICATING THE SAME

(75) Inventors: Min-Gyu Sung, Ichon-shi (KR); Heung-Jae Cho, Ichon-shi (KR); Kwan-Yong Lim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 211 days.

(21) Appl. No.: 11/966,435

(22) Filed: Dec. 28, 2007

(65) Prior Publication Data

US 2009/0115003 A1    May 7, 2009

(30) Foreign Application Priority Data

Nov. 1, 2007   (KR) .................. 10-2007-0111182

(51) Int. Cl.
*H01L 21/336* (2006.01)
*H01L 21/3205* (2006.01)
*H01L 21/4763* (2006.01)
*H01L 21/31* (2006.01)
*H01L 21/469* (2006.01)

(52) U.S. Cl. .................. 438/585; 438/257; 438/772

(58) Field of Classification Search .................. 438/265, 438/299, 229–230, 165, 592
See application file for complete search history.

(56) References Cited

U.S. PATENT DOCUMENTS

| 2004/0005760 A1* | 1/2004 | Rudeck et al. ................ 438/257 |
| 2005/0272232 A1* | 12/2005 | Nam ............................. 438/585 |
| 2008/0146041 A1* | 6/2008 | Sasaki ........................... 438/772 |

FOREIGN PATENT DOCUMENTS

| JP | 2006-005152 | 1/2006 |
| JP | 2006-332594 | 12/2006 |
| KR | 1020050065148 A | 6/2005 |

* cited by examiner

*Primary Examiner* — Ha Tran T Nguyen
*Assistant Examiner* — Valerie Brown
(74) *Attorney, Agent, or Firm* — Kilpatrick Townsend & Stockton LLP (57) ABSTRACT

A method for fabricating a semiconductor device includes forming a stacked layer including a tungsten layer, forming a hard mask pattern over the stacked layer, and oxidizing a surface of the hard mask pattern to form a stress buffer layer. A portion of the stacked layer uncovered by the hard mask pattern is removed using the hard mask pattern and the stress buffer layer as an etch mask, thereby forming a first resultant structure. A capping layer is formed over the first resultant structure, the capping layer is etched to retain the capping layer on sidewalls of the first resultant structure, and the remaining portion of the stacked layer uncovered by the hard mask pattern is removed.

12 Claims, 14 Drawing Sheets

<LEANING FREE GATE>   <LEANING GATE>

FIG. 6E

SEMICONDUCTOR DEVICE AND METHOD FOR FABRICATING THE SAME

CROSS-REFERENCE TO RELATED APPLICATIONS

The present invention claims priority of Korean patent application number 10-2007-0111182, filed on Nov. 1, 2007, which is incorporated by reference in its entirety.

BACKGROUND OF THE INVENTION

The present invention relates to a method for fabricating a semiconductor device, and more particularly, to a semiconductor device capable of preventing a leaning effect and a method for fabricating the same.

In the case of a dynamic random access memory (DRAM) device having a line width under 0.1 μm, an aspect ratio of a gate during formation of a gate structure is dramatically increased as a gate pitch is decreased. A torque is generated on one side when left-right asymmetry of a thermal stress on the gate structure occurs during a subsequent thermal treatment, such as formation of a capping nitride layer. As a result, the gate structure leans to one side (hereinafter, this result is called a leaning effect). Because, the torque is increased as the aspect ratio of the gate is increased, the leaning effect may become increasingly problematic as the gate pitch is decreased.

When the gate leans to one side, a self-aligned contact (SAC) may fail, and thus, production yield may be decreased.

Figure 1A:
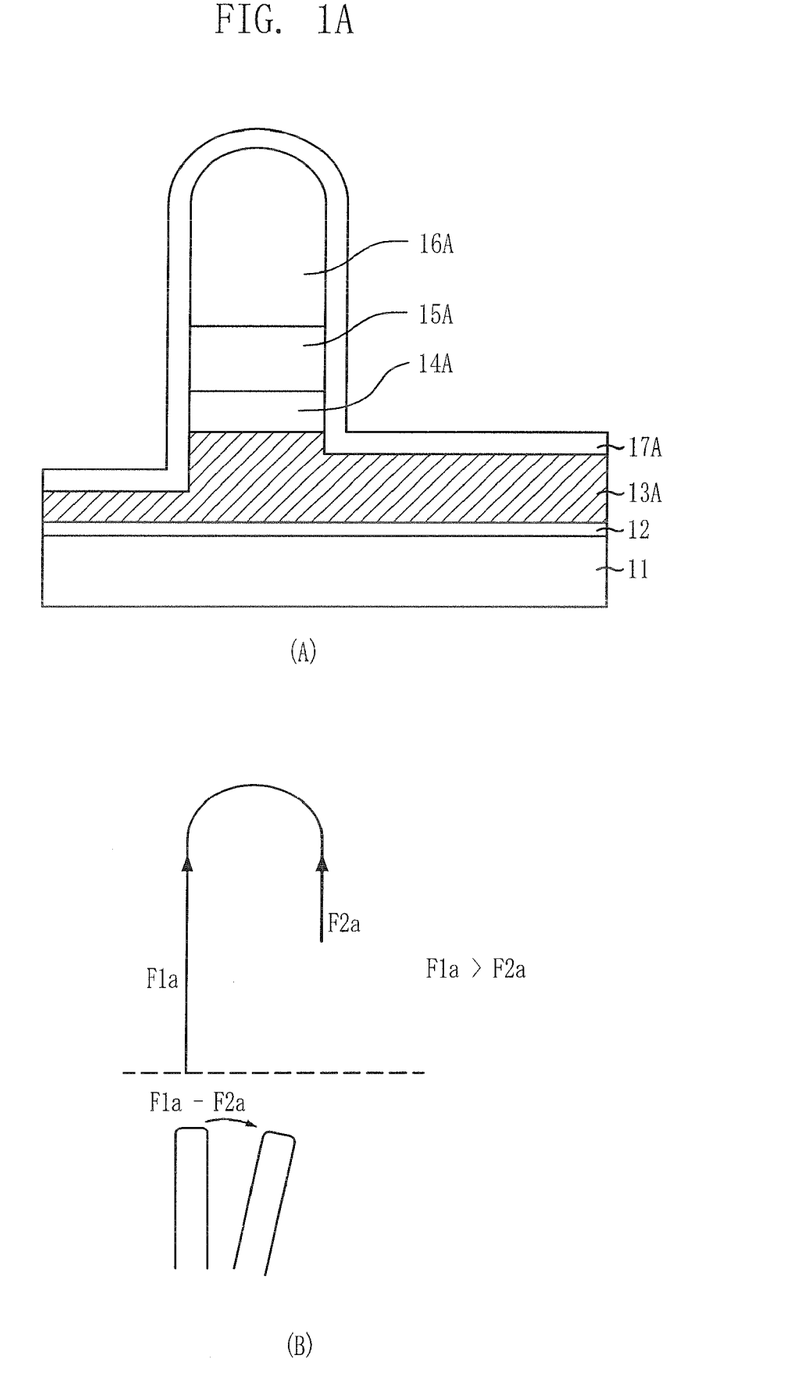
FIGS. 1A to 1C are views illustrating a leaning effect of gates in a typical semiconductor device.
Figure 1B:
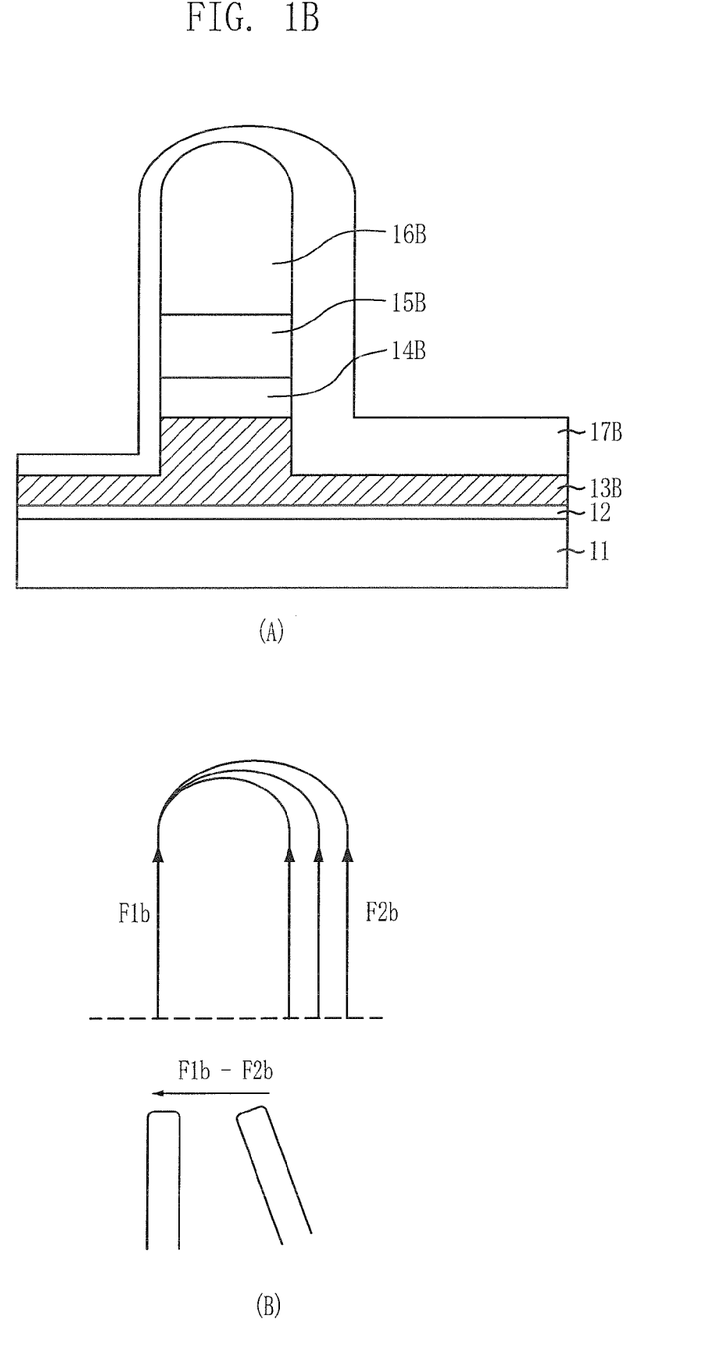
Figure 1C:
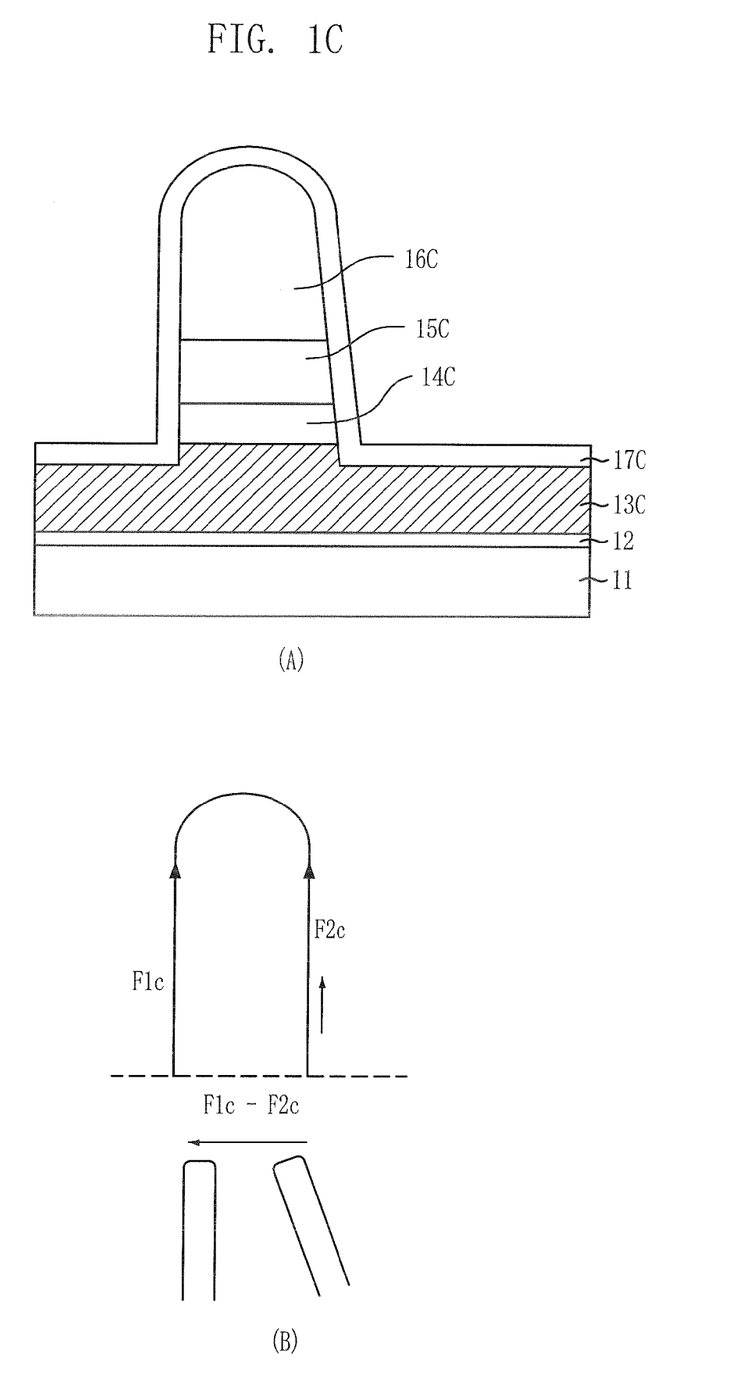

FIGS. 1A to 1C illustrate leaning of a gate structure in accordance with a typical method for fabricating a semiconductor device.

Referring to FIGS. 1A to 1C, an insulation layer 12 is formed over a substrate 11 and then a polysilicon layer, a barrier layer, a tungsten layer, a hard mask layer, and a gate mask are sequentially formed over the insulation layer 12. The hard mask layer, the tungsten layer, the barrier layer are etched, and the polysilicon layer is selectively etched using the gate mask. Therefore, a hard mask pattern 16A, a tungsten pattern 15A, a barrier pattern 14A, and a remaining polysilicon layer 13A are formed over the insulation layer 12, thereby forming a resultant structure. Then, a capping layer 17A is formed over the resultant structure.

Although it is not shown, the capping layer 17A is fully etched and then the remaining polysilicon layer 13A is etched to form a gate structure. Subsequently, a selective oxidation process is performed to improve a damaged edge of the polysilicon layer 13A and to form a bird's beak, thereby improving characteristics of a semiconductor device.

The hard mask pattern 16A and the capping layer 17A include nitride layers. While a subsequent thermal treatment such as formation of the capping layer 17A is performed, the hard mask pattern 16A is expanded due to increasing the density of the hard mask pattern 16A. Thus, a tensile stress is applied to the capping layer 17A that is formed over the hard mask pattern 16A. Since the capping layer 17A covers an entire exposed surface of the gate structure, left-right asymmetry of stress applied on the gate structure causes a torque to be placed one side of the gate structure, which causes the gate structure to lean to one side. In other words, the leaning effect occurs.

Referring to (A) of FIG. 1A, when a right side of the remaining polysilicon layer 13A has a thickness greater than that of a left side of the remaining polysilicon layer 13A, a tensile stress applied on the left side of the capping layer 17A is greater than that applied on the right side of the capping layer 17A because a contact area between the left side of the capping layer 17A and the gate structure is greater than that of the right side of the capping layer 17A. When a force applied by a stress is tensile, a force applied to the left side of capping layer 17A is greater than a force applied to the right side of capping layer 17A.

Referring to (B) of FIG. 1A, a difference between the tensile stresses (i.e., F1a-F2a) causes torque toward a right side because the capping layer 17A covers the entire surface of the gate structure. Thus, since the torque is applied to the gate structure in a vertical direction, the gate structure may lean to the right by a distance related to the difference between the opposing tensile stresses.

Referring to (A) of FIG. 1B, a remaining polysilicon layer 13B has the same thickness as the remaining polysilicon layer 13A in (A) of FIG. 1A. However, a capping layer 17B is formed to have different thicknesses on a left side and a right side of a gate structure. The thickness of the capping layer 17B on the right side is greater than that of the capping layer 17B on the left side. Similar to the stresses described in FIG. 1A, a force applied to the capping layer 17B on the right side is greater than that applied on the left side because the capping layer 17B on the right side is thicker than on the left side. Thus, referring to (B) of FIG. 1B, a difference between the forces (tensile stresses, F2b and F1b) results in a torque toward the left side of the gate structure, which causes the gate structure to lean toward the left side.

Referring to (A) of FIG. 1C, a remaining polysilicon layer 13C has the same thickness as the remaining polysilicon layer 13A in (A) of FIG. 1A. However, when an etching process is performed to form a gate structure, if the right side of the gate structure is not vertically etched, i.e., a profile of a resultant structure is non-uniform, a capping layer 17C is formed to have a slope on the right side of the gate structure. As a result, a contact area between the capping layer 17C on the right side and the gate structure is greater than a contact area between the capping layer 17C on the left side and the gate structure. Thus, referring to (B) of FIG. 5C, a difference between forces (tensile stresses, F2c and F1c) applied to the right side and the left side causes a torque toward the left side of the gate structure, thereby making the gate structure lean toward the left side.

In order to overcome the above described limitations, a post-thermal treatment is performed after the hard mask layer is formed in the process of forming the gate structure. A thermal stress of the hard mask layer is generated before performing the etch process to form the gate structure. Thus, the gate leaning toward one side may be prevented. However, a temperature for the post-thermal treatment should exceed approximately 900° C. to sufficiently generate the thermal stress of the hard mask layer to prevent the gate leaning, so characteristics of devices may be deteriorated due to increasing of a thermal budget.

When decreasing the thickness of the capping layer, the torque, and thus the leaning of the gate structure, decreases. However, when the thickness of the capping layer is under approximately 50 Å, a barrier layer may be abnormally oxidized since hydrogen $H_2$ and oxygen $O_2$ gases may not be sufficiently blocked in a subsequent selective oxidation process. Thus, characteristics of the semiconductor devices may be deteriorated.

Figure 2:
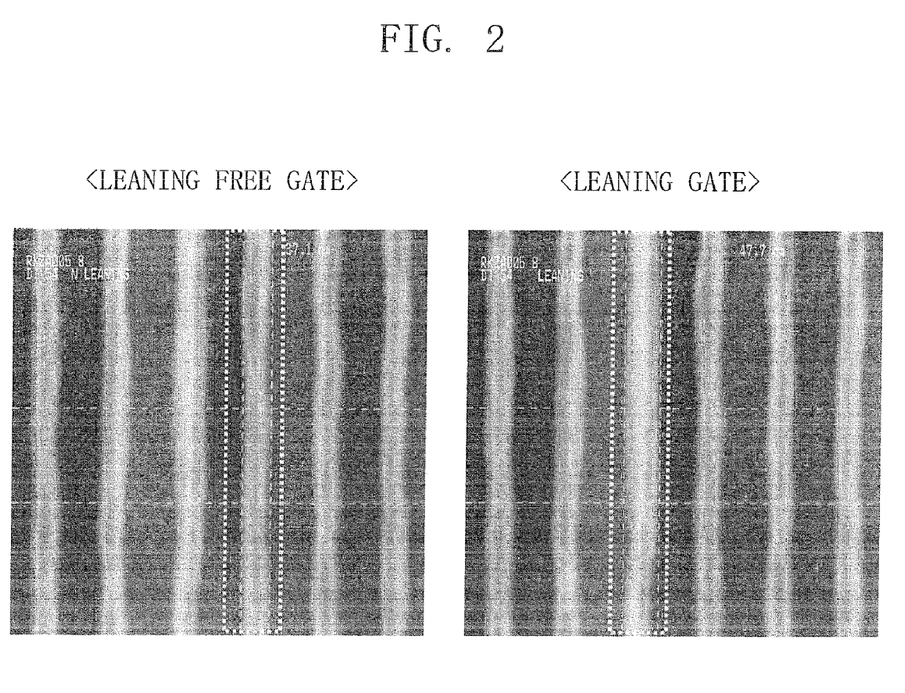
FIG. 2 is micrographic views illustrating a leaning gate and a leaning free gate.

FIG. 2 shows micrographic views illustrating a leaning effect of a gate. Referring to FIG. 2, it may be recognized that a critical dimension of a leaning gate on a right side is greater than a critical dimension of a leaning free gate on a left side.

SUMMARY OF THE INVENTION

Embodiments of the present invention are directed to provide a method for fabricating a semiconductor device, and particularly, to a semiconductor device capable of fundamentally preventing the leaning of a gate caused by a thermal stress of a hard mask layer that occurs while performing a subsequent thermal treatment, and a method for fabricating the same.

In accordance with a first aspect of the present invention, a method for fabricating a semiconductor device includes forming a stacked layer including a tungsten layer, forming a hard mask pattern over the stacked layer, and oxidizing a surface of the hard mask pattern, thereby forming a stress buffer layer. A portion of the stacked layer uncovered by the hard mask pattern is removed using the hard mask pattern and the stress buffer layer as an etch mask, thereby forming a first resultant structure. A capping layer is formed over the first resultant structure, the capping layer is etched to retain the capping layer on sidewalls of the first resultant structure, and the remaining portion of the stacked layer uncovered by the hard mask pattern is removed.

In accordance with a second aspect of the present invention, a method for fabricating a semiconductor device includes forming a stacked layer including a tungsten layer, forming a hard mask layer over the stacked layer, and etching a portion of the hard mask layer, thereby forming a hard mask pattern including a hard mask pattern portion and a hard mask layer portion. To form a first resultant structure, a stress buffer layer is formed over the hard mask pattern and then the hard mask layer portion, a portion of the stress buffer layer formed on the hard mask layer portion, and a portion of the stacked layer uncovered by the hard mask pattern portion are removed. A capping layer is formed over the first resultant structure, the capping layer is etched to retain the capping layer on sidewalls of the first resultant structure, and the remaining portion of the stacked layer uncovered by the hard mask pattern portion is removed.

In accordance with a third aspect of the present invention a method for fabricating a semiconductor device. includes forming a stacked layer including a tungsten layer, forming a hard mask layer over the stacked layer, and etching the hard mask layer, thereby forming a hard mask pattern. A thermal treatment is performed on the hard mask pattern, and a portion of the stacked layer is removed, thereby forming a first resultant structure. A capping layer is formed over the first resultant structure, the capping layer is etched to retain the capping layer on sidewalls of the first resultant structure, and a portion of the exposed stacked layer is removed by etching the capping layer.

In accordance with a fourth aspect of the present invention, a semiconductor device includes a substrate, a pattern including a conductive layer and a hard mask layer stacked over the substrate, a capping layer surrounding sidewalls of the pattern, and a stress buffer layer disposed between the hard mask layer and the capping layer.

DESCRIPTION OF SPECIFIC EMBODIMENTS

In accordance with embodiments of the present invention, since a stress buffer layer is formed before forming a capping layer, a thermal stress caused by increasing the density of a hard mask layer during a subsequent thermal process may not be conveyed up to the capping layer. Therefore, although the capping layer is asymmetrically formed to have different contact areas on a left side and a right side of a gate structure, a torque may not be caused by the thermal stress; thus, the leaning of a gate structure may be prevented.

Furthermore, since a selective etching process is performed on a hard mask layer before performing a thermal treatment, the thermal treatment is performed on the hard mask layer having a volume smaller than an initial volume of the hard mask layer. Therefore, a thermal stress applied on a bottom of an underlying insulation layer during an increase in the density of the hard mask layer is much smaller than a thermal stress of the insulation layer when the hard mask layer was formed. Thus, characteristics of devices may be improved.

The embodiments of the present invention relate to a method for controlling the leaning of gates regardless of a thermal stress of a hard mask layer, which is generated in a subsequent thermal treatment.

FIGS. 3A to 3E illustrate cross-sectional views of a method for fabricating a semiconductor device in accordance with a first embodiment of the present invention.

Figure 3A:
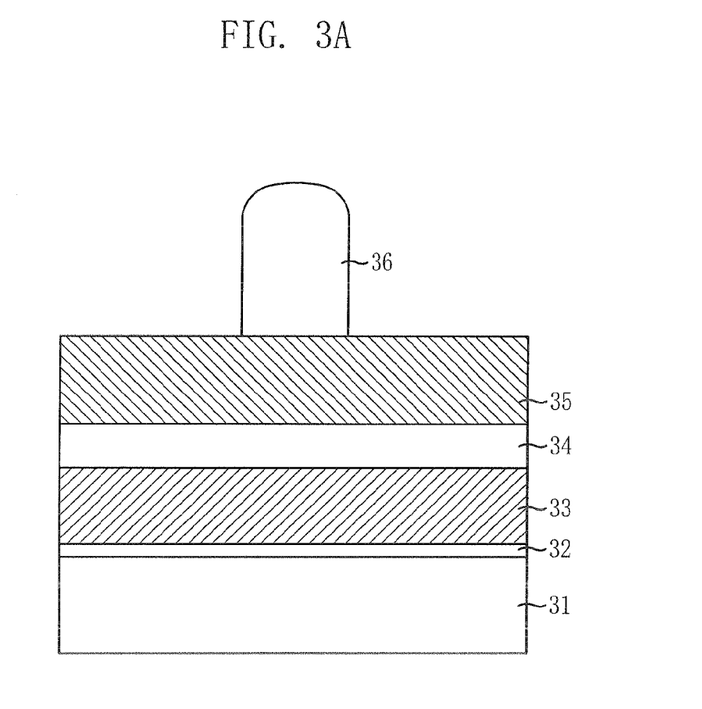
FIGS. 3A to 3E illustrate cross-sectional views of a method for fabricating a semiconductor device in accordance with a first embodiment of the present invention.

Referring to FIG. 3A, an insulation layer 32 is formed over a substrate 31. A polysilicon layer 33, a barrier layer 34 and a tungsten (W) layer 35 are sequentially stacked over the insulation layer 32. The barrier layer 34 includes a tungsten nitride ($WN_X$) layer, and the barrier layer 34 and the tungsten layer 35 may be formed by performing a physical vapor deposition (PVD) process. Furthermore, the tungsten layer 35 may be formed by performing a chemical vapor deposition (CVD) process or an atomic layer deposition (ALD) process.

A hard mask layer is formed over the tungsten layer 35, and then a mask pattern (not shown) is formed over the hard mask layer. The mask pattern includes a photoresist layer. The hard mask layer is etched using the mask pattern and thus, a hard mask pattern 36 is formed. The hard mask pattern 36 includes a nitride layer, preferably a silicon nitride layer.

Figure 3B:
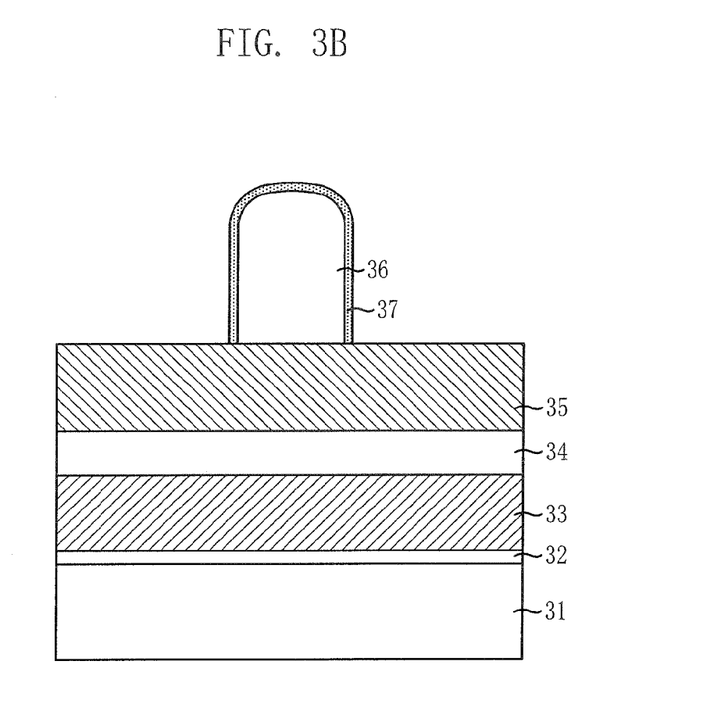

Referring to FIG. 3B, after removing the mask pattern, a surface of the hard mask pattern 36 is oxidized, thereby forming a stress buffer layer 37. The stress buffer layer 37 prevents a thermal stress from being applied to a capping layer 38 (FIG. 3D) wherein the thermal stress is generated by increasing the density of the hard mask pattern 36 in a thermal process, such as a process of forming the capping layer. Furthermore, the stress buffer layer 37 weakens a mutual adhesive strength between the hard mask pattern 36 and the capping layer 38.

It is preferable that the stress buffer layer 37 includes an oxide layer and the oxide layer is formed by a plasma oxidation process, which may be performed at a low temperature. When an oxidation process is performed while the tungsten layer 35, which is under the hard mask pattern 36, is exposed, the tungsten layer 35 may be abnormally oxidized. Thus, the plasma oxidation process where a selective oxidation process can be performed is used to form the stress buffer layer 37.

The selective oxidation process to form the stress buffer layer 37 can selectively oxidize silicon without oxidizing the tungsten layer 35 due to a difference of driving forces between oxidation of tungsten and oxidation of silicon.

For example, the selective oxidation process is performed in an atmosphere of a mixture of $H_2O$ and $H_2$ and at a temperature ranging from approximately 600° C. to approximately 800° C. Furthermore, the selective oxidation process may be performed in an atmosphere of oxygen plasma and at a temperature of less than approximately 600° C., preferably ranging from approximately 200° C. to approximately 600° C.

Since the hard mask pattern 36 includes the silicon nitride layer, the oxide layer formed by performing the selective oxidation process is a silicon oxide layer formed by oxidizing the surface of the silicon nitride layer.

Figure 3C:
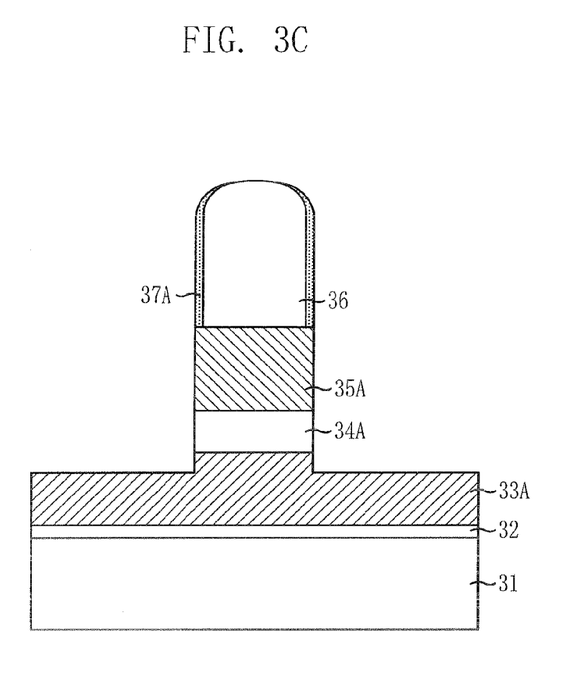

Referring to FIG. 3C, the tungsten layer 35 and the barrier layer 34 are etched and an upper portion of the polysilicon layer 33 is partially etched. This etching process is referred to as a first gate etching process. As a result of the first gate etching process, a pattern including a stack structure of an etched polysilicon layer 33A, an etched barrier layer 34A, an etched tungsten layer 35A, and the hard mask pattern 36 is formed. When the first gate etching process is performed, a portion of the stress buffer layer 37 over the hard mask pattern 36 is removed. Thus, the other portion of the stress buffer layer 37A remains on sidewalls of the hard mask pattern 36, thereby forming a first resultant structure.

Figure 3D:
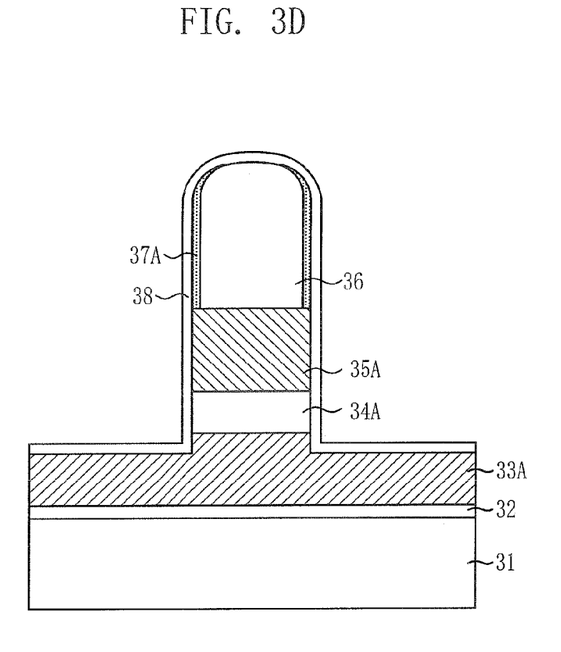

Referring to FIG. 3D, the capping layer 38 is formed over the first resultant structure. The capping layer 38 prevents abnormal oxidation of the etched tungsten layer 35A and the etched barrier layer 34A during a subsequent re-oxidation process. The capping layer 38 includes a nitride-containing layer, preferably a silicon nitride ($Si_3N_4$) layer, and has a thickness ranging from approximately 50 Å to approximately 200 Å.

Figure 3E:
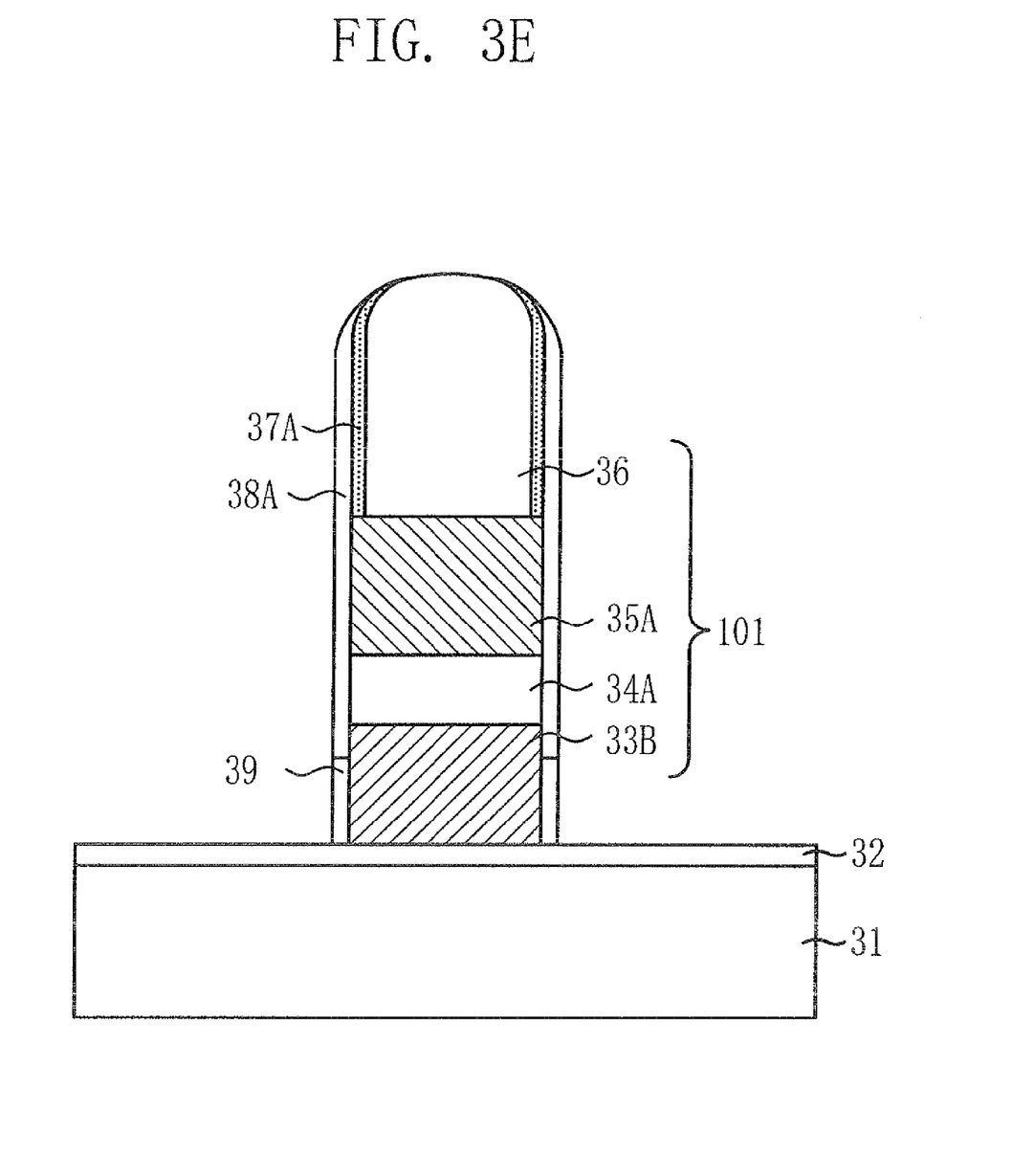

Referring to FIG. 3E, a blanket etching process is performed on the capping layer 38 to expose the etched polysilicon layer 33A. A second gate etching process is performed to etch the exposed etched polysilicon layer 33A. Thus, a gate structure 101 includes a stack structure of a remaining polysilicon layer 33B, the etched barrier layer 34A, the etched tungsten layer 35A and the hard mask pattern 36, as well as an etched capping layer 38A that remains on a portion of sidewalls of the gate structure 101.

The re-oxidation process is performed to cure damage of exposed sidewalls of the remaining polysilicon layer 33B. Since the re-oxidation process is performed in an atmosphere of hydrogen to selectively oxidize the exposed sidewalls of the remaining polysilicon layer 33B, abnormal oxidation of the etched tungsten layer 35A and the etched barrier layer 34A is prevented by the etched capping layer 38A. Thus, an oxide layer 39 is selectively formed on the exposed sidewalls of the remaining polysilicon layer 33B by the re-oxidation process.

Preferably, the re-oxidation process is performed by adopting the selective oxidation method, which due to a difference of driving forces between oxidation of tungsten and oxidation of silicon, can be used to selectively oxidize silicon in the remaining polysilicon layer 33B without oxidizing the etched tungsten layer 35A. The re-oxidation process is performed in an atmosphere of a mixture of $H_2O$ and $H_2$ and at a temperature ranging from approximately 600° C. to approximately 1,000° C.

Table 1 shows a result of critical dimension differences between a region having leaning gates and another region having non-leaning gates.

TABLE 1

| | Plasma oxidation applied | | Plasma oxidation omitted | |
| --- | --- | --- | --- | --- |
| Existence of leaning gate | ○ | X | ○ | X |
| Critical Dimension (nm) | 53.1 | 53.6 | 53.2 | 52.5 |
| | 52.1 | 53.5 | 54.3 | 50.7 |
| | 52.1 | 51.7 | 51.9 | 52.6 |
| | 52.6 | 51.0 | 53.7 | 51.4 |
| | 50.6 | 50.4 | 49.5 | 52.6 |
| | 51.7 | 50.4 | 51.3 | 52.7 |
| | | | 50.6 | 52.7 |
| | | | 52.2 | 49.1 |
| | | 52.1 | | 49.0 |
| | | 51.2 | | 52.4 |
| | | 52.9 | | 52.3 |
| | | 53.7 | | 51.4 |
| | | | | 50.1 |
| Average (nm) | 52.0 | 51.9 | 52.4 | 51.4 |
| CD Difference between L and NL (nm) | 0.1 | | 1.0 | |

L and NL represent leaning and no leaning, respectively

Referring to Table. 1, when the stress buffer layer formed by the plasma oxidation is not adopted, a difference between an average of critical dimensions of leaning gates and that of leaning free gates is 1 nm. On the other hand, when the stress buffer layer formed by the plasma oxidation is employed, a difference of average of critical dimensions between leaning gates and leaning free gates is dramatically decreased to 0.1 nm.

Figure 4:
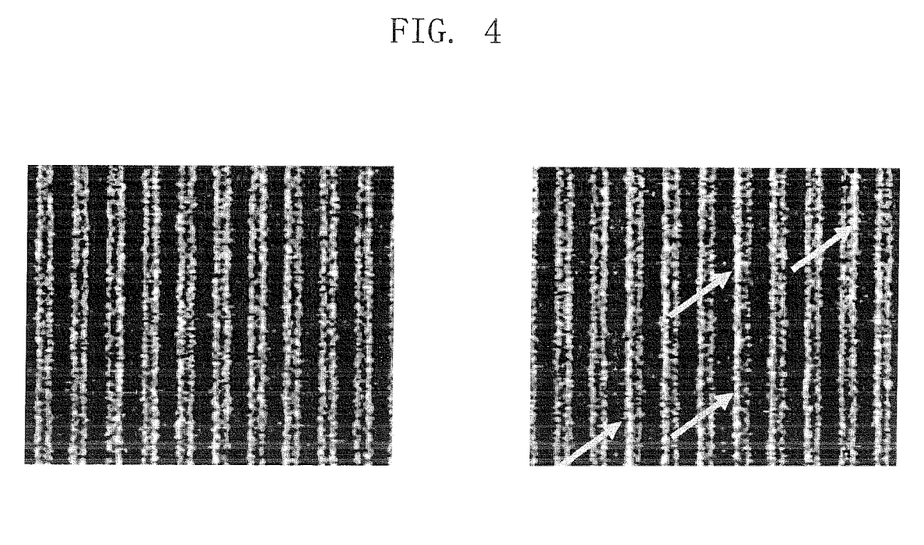
FIG. 4 illustrates micrographic views of leaning degrees depending on whether or not a stress buffer layer is adopted.

FIG. 4 illustrates micrographic views that show degrees of leaning due to whether or not a stress buffer layer is used.

Referring to FIG. 4, it is noticed that, when a stress buffer layer formed by a plasma oxidation is adopted (refer to left side of FIG. 4), leaning of gates is prevented as compared to when the stress buffer layer formed by the plasma oxidation is not employed (refer to right side of FIG. 4). thereby causing leaning of the gates as indicated by arrows in FIG. 4.

FIGS. 5A to 5E illustrate cross-sectional views of a method for fabricating a semiconductor device in accordance with a second embodiment of the present invention.

Figure 5A:
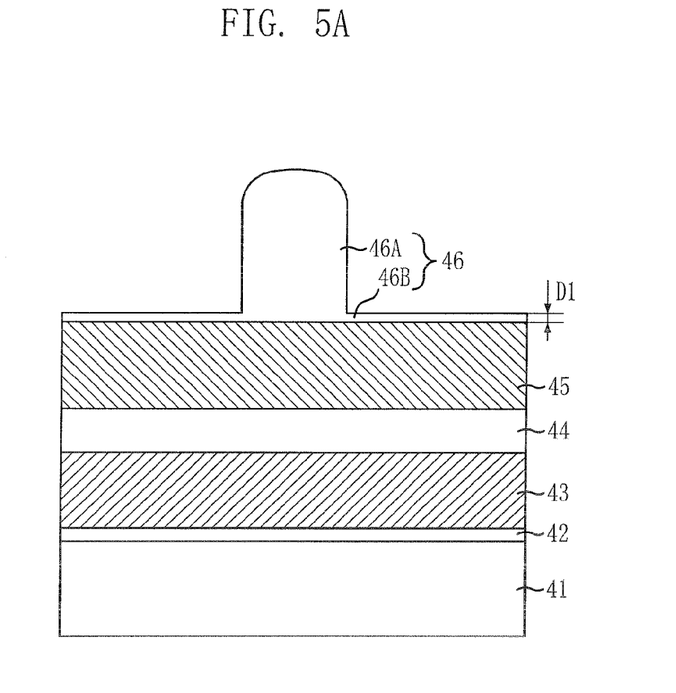
FIGS. 5A to 5E illustrate cross-sectional views of a method for fabricating a semiconductor device in accordance with a second embodiment of the present invention.

Referring to FIG. 5A, an insulation layer 42 is formed over a substrate 41. A polysilicon layer 43, a barrier layer 44, and a tungsten (W) layer 45 are sequentially stacked over the insulation layer 42. The barrier layer 44 includes a tungsten nitride ($WN_X$) layer, and the barrier layer 44 and the tungsten layer 45 may be formed by performing a physical vapor deposition (PVD) process. Furthermore, the tungsten layer 45 may be formed by performing a chemical vapor deposition (CVD) process or an atomic layer deposition (ALD) process.

A hard mask layer is formed over the tungsten layer 45, and then a mask pattern (not shown) is formed over the hard mask layer. The mask pattern includes a photoresist layer. The hard mask layer is partially etched using the mask pattern to form a hard mask pattern 46 that includes a hard mask pattern portion 46A and a hard mask layer portion 46B. The hard mask pattern 46 includes a nitride layer, preferably a silicon nitride layer.

When forming the hard mask pattern 46, the hard mask layer is etched to retain the hard mask layer portion 46B, which has a given thickness D1, over the tungsten layer 45. The hard mask layer portion 46B prevents the tungsten layer 45 from being oxidized in a subsequent process for forming a stress buffer layer. The given thickness D1 of the hard mask layer portion 46B ranges from approximately 10 Å to approximately 100 Å. Since the hard mask layer portion 46B deviates from a gate structure target region, it will be removed by a subsequent blanket etching process to expose a surface of a corresponding portion of the tungsten layer 45.

Figure 5B:
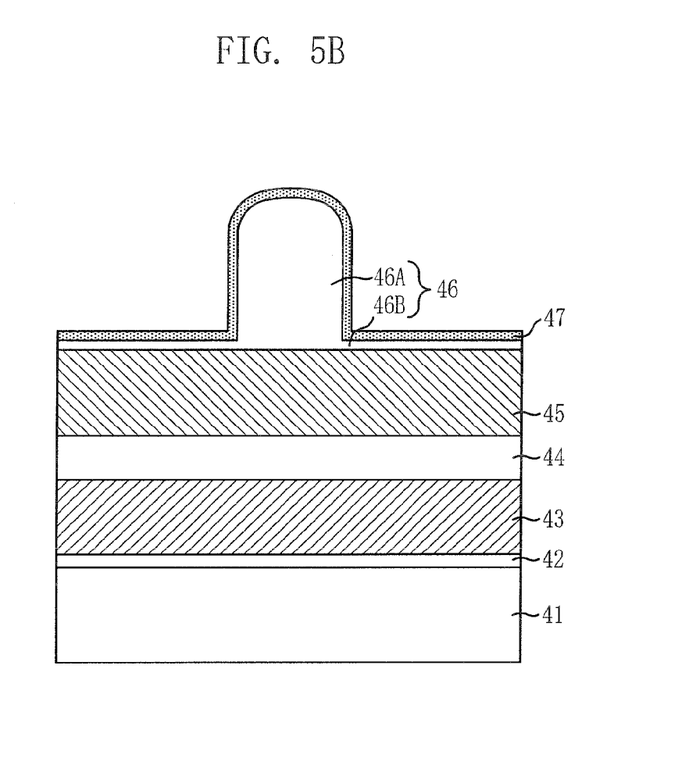

Referring to FIG. 5B, after removing the mask pattern, the stress buffer layer 47 is formed over a surface of the hard mask pattern 46. The stress buffer layer 47 prevents a thermal stress from being applied to a capping layer 48 (FIG. 5D). The thermal stress is generated by increasing the density of an etched hard mask pattern portion 46C (FIG. 5C) in a thermal process, such as a process of forming the capping layer 48.

Furthermore, the stress buffer layer 47 weakens a mutual adhesive strength between the hard mask pattern 46 and the capping layer 48.

It is possible that the stress buffer layer 47 includes an oxide layer, and the oxide layer is formed by known methods including a selective oxidation process. Furthermore, the oxide layer includes any material that does not change device characteristics by heat applied during a formation of the stress buffer layer 47 and that may weaken a mutual adhesive strength between the hard mask pattern 46 and the capping layer 48. For example, the stress buffer layer 47 is formed by performing an atomic layer deposition (ALD) process, which may be performed at a low temperature, for example at a temperature under approximately 200° C.

Figure 5C:
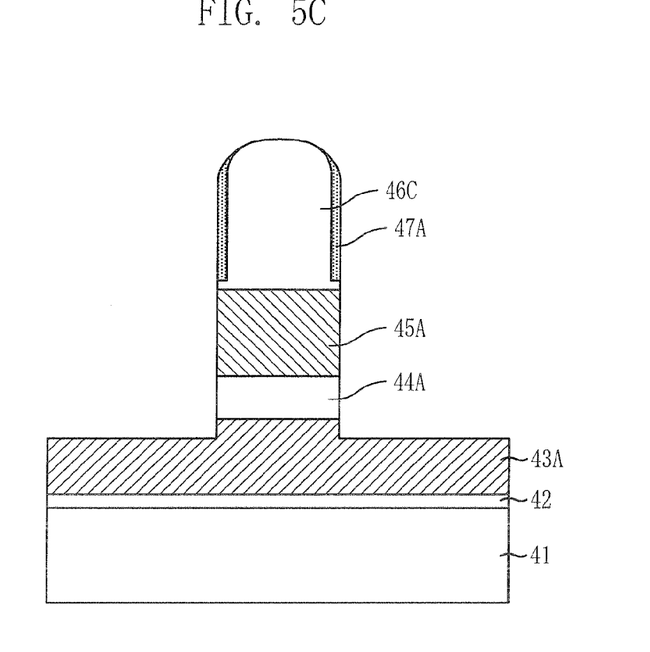
Figure 5D:
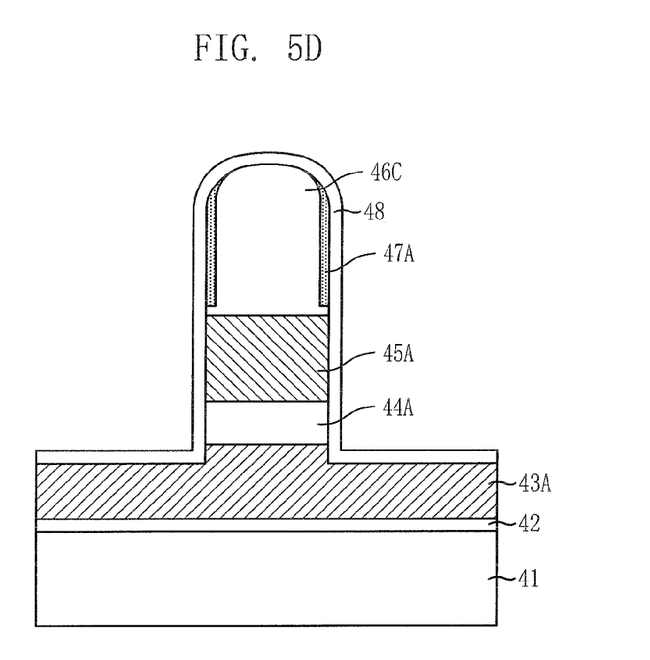

Referring to FIG. 5C, the tungsten layer 45 and the barrier layer 44 are etched using the hard mask pattern 46 as an etch barrier, and a portion of the polysilicon layer 43 is etched. The etching process for etching the portion of the polysilicon layer 43 is referred to as a first gate etching process. While the first gate etching process is performed, the hard mask layer portion 46B is removed and the stress buffer layer 47 over an upper portion of the hard mask pattern portion 46A is also etched. Therefore, a stress buffer layer 47A remains on sidewalls of an etched hard mask pattern portion 46C. Thus, a pattern including a stack of a partially etched polysilicon layer 43A, an etched barrier layer 44A, an etched tungsten layer 45A, and the etched hard mask pattern portion 46C is formed, thereby forming a first resultant structure.

Referring to FIG. 5D, a capping layer 48 is formed over the first resultant structure. The capping layer 48 prevents abnormal oxidation of the etched tungsten layer 45A and the etched barrier layer 44A during a subsequent re-oxidation process. The capping layer 48 includes a nitride-containing layer, preferably a silicon nitride ($Si_3N_4$) layer, and has a thickness ranging from approximately 50 Å to approximately 200 Å.

Figure 5E:
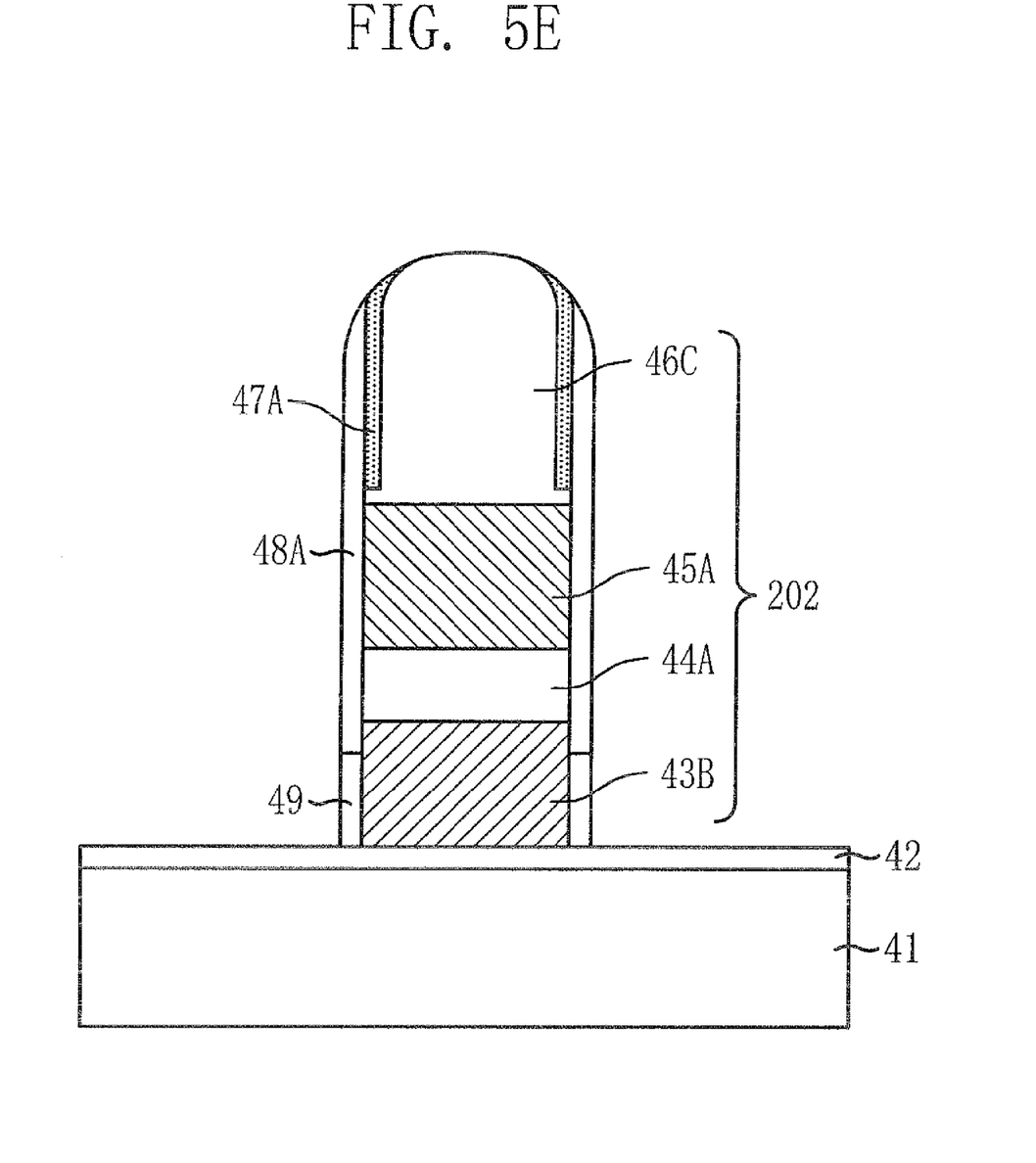

Referring to FIG. 5E, a blanket etching process is performed on the capping layer 48 to expose the partially etched polysilicon layer 43A. A second gate etching process is performed to etch an exposed portion of the partially etched polysilicon layer 43A. Thus, a gate structure 202 includes a stack structure of a remaining polysilicon layer 43B, the etched barrier layer 44A, the etched tungsten layer 45A, and the etched hard mask pattern portion 46C. In addition, an etched capping layer 48A remains on a portion of sidewalls of the gate structure 202.

The re-oxidation process is performed to cure damage of exposed sidewalls of the remaining polysilicon layer 43B. Since the re-oxidation process is performed in an atmosphere of hydrogen to selectively oxidize exposed sidewalls of the remaining polysilicon layer 43B, abnormal oxidation of the etched tungsten layer 45A and the etched barrier layer 44A is prevented by the etched capping layer 48A. Thus, an oxide layer 49 is selectively formed on the exposed sidewalls of the remaining polysilicon layer 43B by the re-oxidation process.

Preferably, the re-oxidation process is performed by adopting the selective oxidation method, which due to a difference of driving forces between oxidation of tungsten and oxidation of silicon, can be used to selectively oxidize the silicon in the remaining polysilicon layer 43B without oxidizing the etched tungsten layer 45A. The re-oxidation process is performed in an atmosphere of a mixture of $H_2O$ and $H_2$ and at a temperature ranging from approximately 600° C. to approximately 1,000° C.

FIGS. 6A to 6E illustrate cross-sectional views of a method for fabricating a semiconductor device in accordance with a third embodiment of the present invention.

Figure 6A:
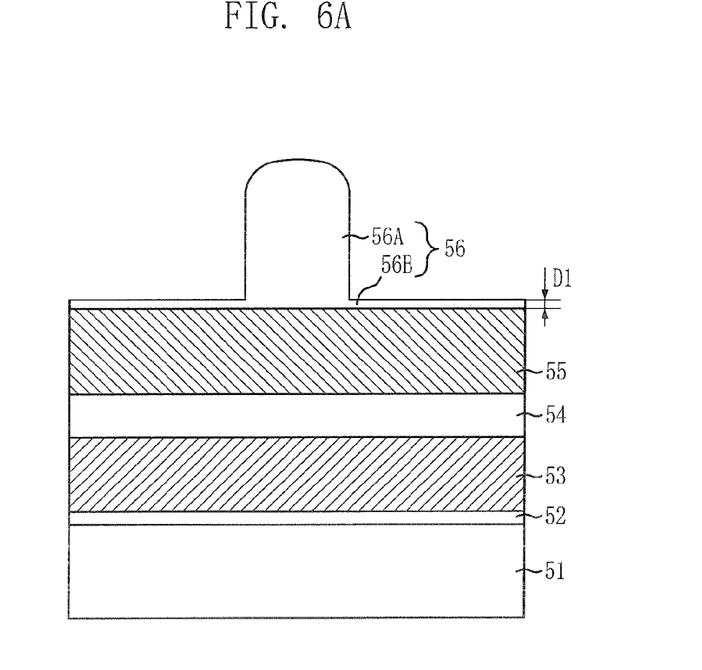
FIGS. 6A to 6E illustrate cross-sectional views of a method for fabricating a semiconductor device in accordance with a third embodiment of the present invention.

Referring to FIG. 6A, an insulation layer 52 is formed over a substrate 51. A polysilicon layer 53, a barrier layer 54, and a tungsten (W) layer 55 are sequentially stacked over the insulation layer 52. The barrier layer 54 includes a tungsten nitride ($WN_x$) layer, and the barrier layer 54 and the tungsten layer 55 may be formed by performing a physical vapor deposition (PVD) process. Furthermore, the tungsten layer 55 may be formed by performing a chemical vapor deposition (CVD) process or an atomic layer deposition (ALD) process.

A hard mask layer is formed over the tungsten layer 55, and then a mask pattern (not shown) is formed over the hard mask layer. The mask pattern includes a photoresist layer. The hard mask layer is partially etched using the mask pattern to form a hard mask pattern 56 that includes a hard mask pattern portion 56A and a hard mask layer portion 56B. The hard mask pattern 56 includes a nitride layer, preferably a silicon nitride layer.

When forming the hard mask pattern 56, the hard mask layer is etched to retain the hard mask layer portion 56B having a given thickness D1 over the tungsten layer 55. The hard mask layer portion 56B prevents the tungsten layer 55 from being oxidized in a subsequent process for forming a stress buffer layer. The given thickness D1 of the hard mask layer portion 56B ranges from approximately 10 Å to approximately 100 Å. Since the hard mask layer portion 56B deviates from a gate structure target region, it will be removed by a subsequent blanket etching process that exposes a surface of a corresponding portion of the tungsten layer 55. The tungsten layer 55 may be exposed when performing the etching process for forming the hard mask pattern 56.

Figure 6B:
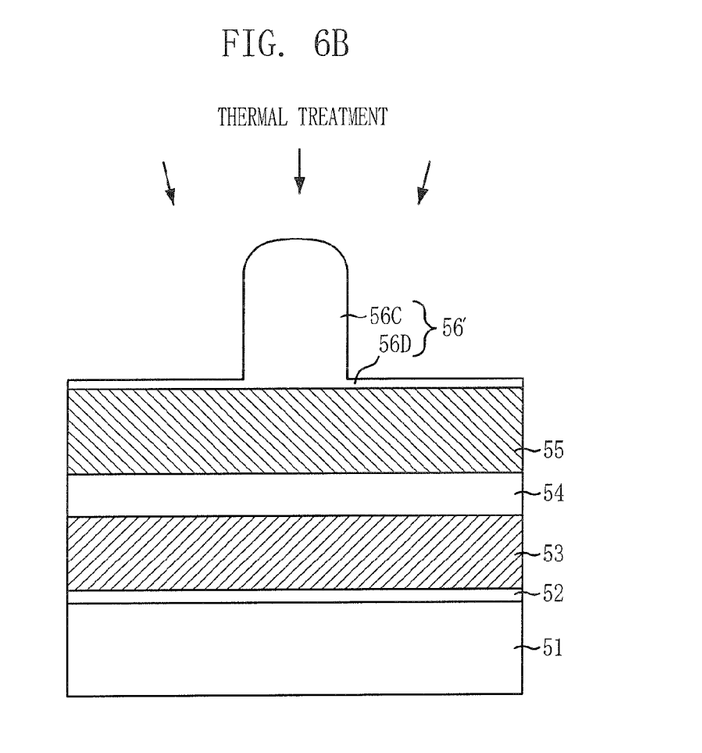

Referring to FIG. 6B, after removing the mask pattern, a thermal treatment is performed on the hard mask pattern 56. The thermal treatment is performed at a temperature over approximately 800° C., preferably ranging from approximately 800° C. to approximately 1,000° C., for increasing the density of the hard mask pattern 56. As disclosed herein, materials with an increased density due to a thermal treatment will be referred to as "dense." Thus, a dense hard mask pattern 56' including a dense hard mask pattern portion 56C and a dense hard mask layer portion 56D is formed over the tungsten layer 55. The thermal treatment may be performed in a furnace or be performed using a rapid thermal annealing.

The hard mask layer portion 56B prevents the tungsten layer 55 from being oxidized by covering the tungsten layer 55 during the thermal treatment. In another embodiment, if the hard mask layer portion 56B is removed to expose a surface of the tungsten layer 55 before performing the thermal treatment, the thermal treatment is performed in an atmosphere of $H_2$ or in a vacuum to prevent the tungsten layer 55 from being abnormally oxidized.

As described above, since the thermal treatment is performed over the hard mask pattern 56 having a volume smaller than its initial volume, a thermal stress applied on the underlying insulation layer 52 while increasing the density of the hard mask pattern 56 is much smaller than a thermal stress when the hard mask pattern 56 was formed.

For example, when the present invention described above is used to form a p-channel metal-oxide-semiconductor (PMOS) transistor, a percolation of boron by the thermal stress may be prevented. Furthermore, when the present invention described above is used to form an n-channel metal-oxide-semiconductor (NMOS) transistor, strength deterioration of the insulation layer may be improved due to decreasing of a thermal stress on the insulation layer.

Figure 6C:
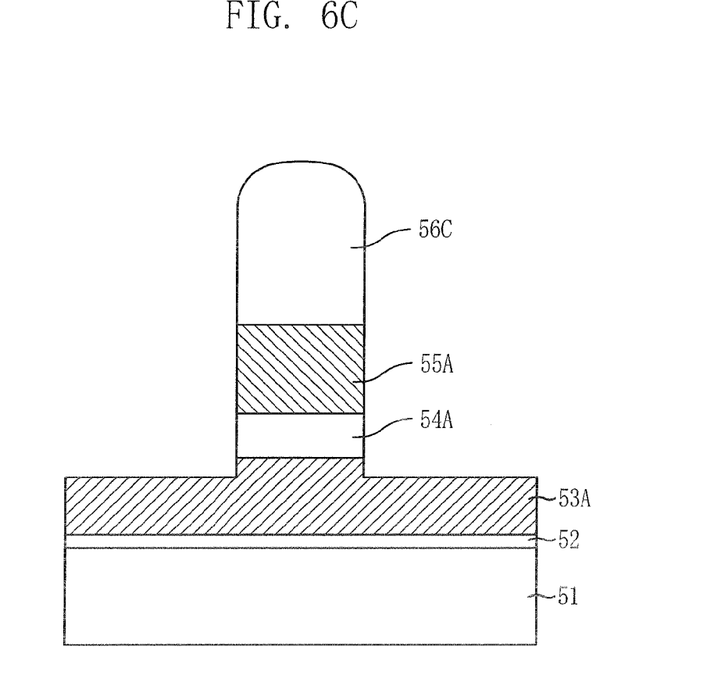

Referring to FIG. 6C, a first blanket etching process is performed on the dense hard mask pattern 56' to expose the tungsten layer under the dense hard mask layer portion 56D. The tungsten layer 55 and the barrier layer 54 are etched using the dense hard mask pattern portion 56C as an etch barrier, and a portion of the polysilicon layer 53 is etched. This etching process is referred to as a first gate etching process. The tungsten layer 55 may be slightly etched using the dense hard mask pattern portion 56C as an etch barrier to expose the surface of the tungsten layer 55. During the etching process the dense hard mask layer portion 56D having a thickness D1 may be removed. Thus, a pattern including a stack structure of a partially etched polysilicon layer 53A, an etched barrier layer 54A, an etched tungsten layer 55A and the dense hard mask pattern portion 56C is formed.

Figure 6D:
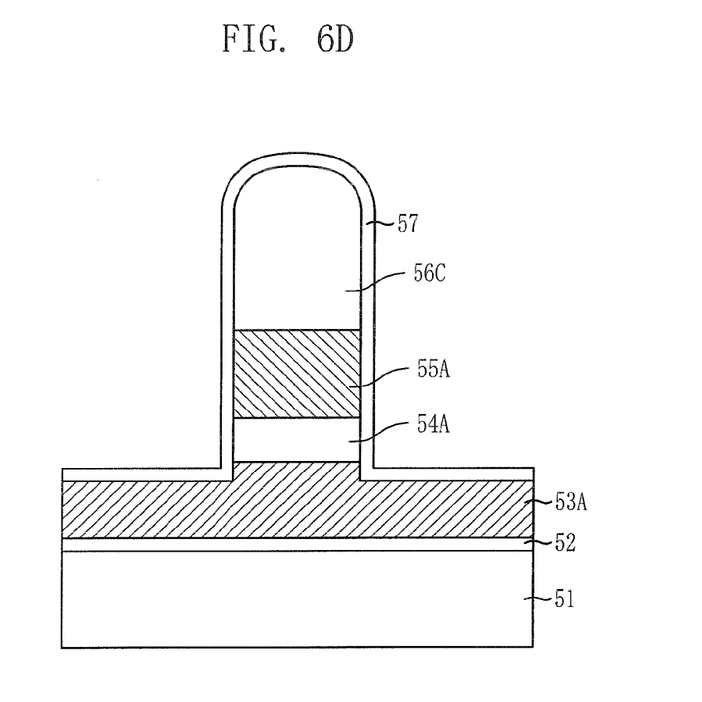

Referring to FIG. 6D, a capping layer 57 is formed over the pattern. The capping layer 57 prevents the etched tungsten layer 55A and the etched barrier layer 54A from abnormal oxidation during a subsequent re-oxidation process. The capping layer 57 includes a nitride-containing layer, preferably a silicon nitride ($Si_3N_4$) layer, and has a thickness ranging from approximately 50 Å to approximately 200 Å.

Figure 6E:
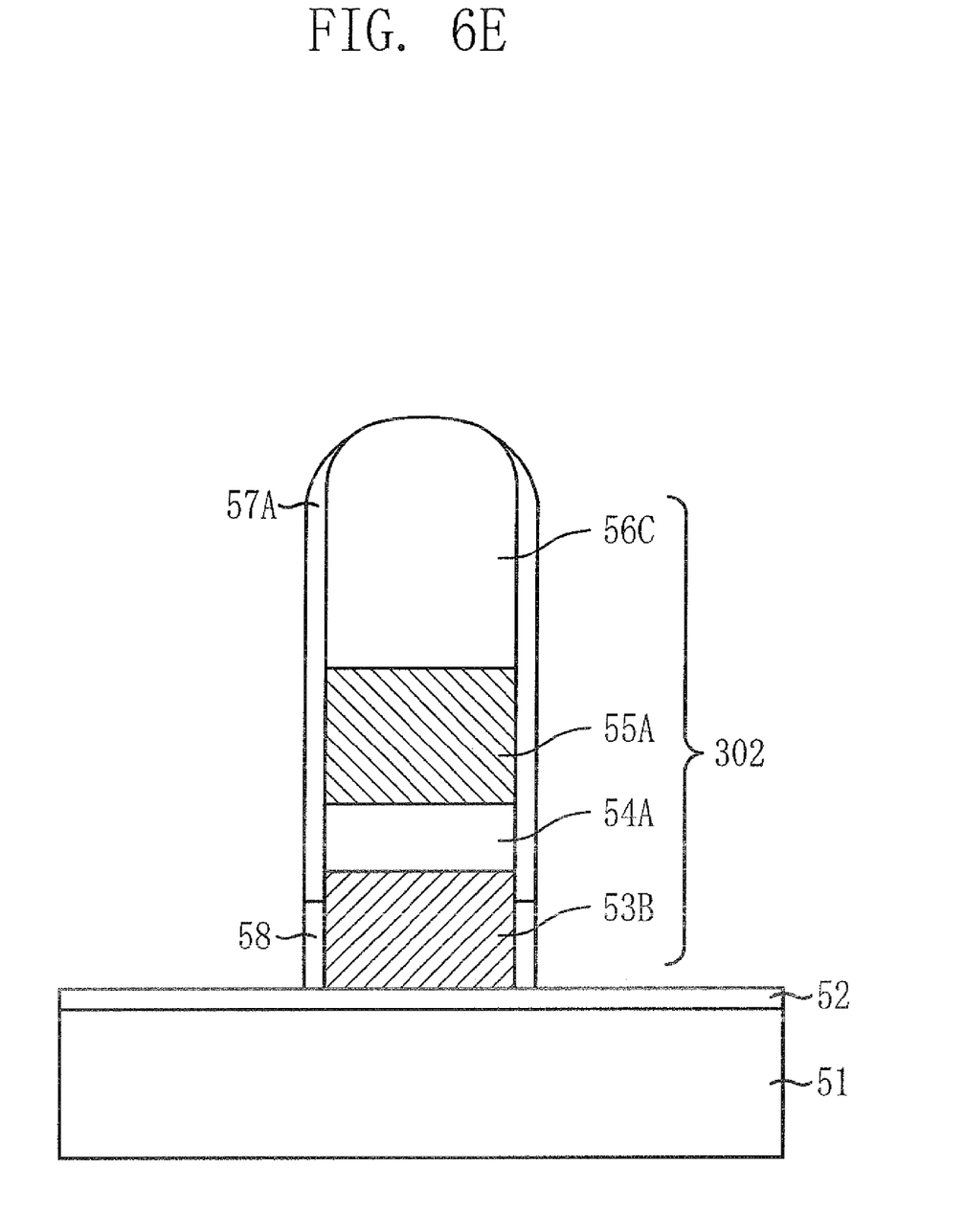

Referring to FIG. 6E, a second blanket etching process is performed to expose the partially etched polysilicon layer 53A. A second gate etching process is performed to etch an exposed portion of the partially etched polysilicon layer 53A. Thus, a gate structure 302 includes a stack structure of a remaining polysilicon layer 53B, the etched barrier layer 54A, the etched tungsten layer 55A, and the etched hard mask pattern portion 56C. In addition, an etched capping layer 57A remains on a portion of sidewalls of the gate structure 302.

The re-oxidation process is performed to cure damage of exposed sidewalls of the remaining polysilicon layer 53B. Since the re-oxidation process is performed in an atmosphere of hydrogen to selectively oxidize exposed sidewalls of the remaining polysilicon layer 53B, abnormal oxidation of the etched tungsten layer 55A and the etched barrier layer 54A is prevented by the etched capping layer 57A. Thus, an oxide layer 58 is selectively formed on the exposed sidewalls of the remaining polysilicon layer 53B by the re-oxidation process.

Preferably, the re-oxidation process is performed by adopting the selective oxidation method, which due to a difference of driving forces between oxidation of tungsten and oxidation of silicon, can be used to selectively oxidize the silicon in the remaining polysilicon layer 53B without oxidizing the etched tungsten layer 55A. The re-oxidation process is performed in an atmosphere of a mixture of $H_2O$ and $H_2$ and at a temperature ranging from approximately 600° C. to approximately 1,000° C.

The present invention may be applied to any process including a formation of a hard mask layer over sidewalls of a pattern. For example, the present invention is applicable to a formation of a bit line or a formation of a metal interconnection and is also applicable to a formation of a gate structure in a flash memory device.

While the present invention has been described with respect to specific embodiments, the above embodiments of the present invention are illustrative and should not be viewed as limiting. It will be apparent to those skilled in the art that various changes and modifications may be made without departing from the spirit and scope of the invention as defined in the following claims.

What is claimed is:

1. A method for fabricating a semiconductor device, the method comprising, sequentially:
    forming a stacked layer including a tungsten layer;
    forming a hard mask pattern over the stacked layer;
    oxidizing a surface of the hard mask pattern, thereby forming a stress buffer layer;
    removing a portion of the stacked layer in order to remove a portion of the tungsten layer by using the hard mask pattern and the stress buffer layer as an etch mask, thereby forming a first resultant structure;
    forming a capping layer over the first resultant structure, wherein the stress buffer layer is formed between the hard mask pattern and the capping layer to inhibit transfer of stress from the hard mask pattern to the capping layer during a subsequent thermal process so as to inhibit leaning of the capping layer;
    etching the capping layer to retain the capping layer on sidewalls of the first resultant structure; and
    removing the remaining portion of the stacked layer uncovered by the hard mask pattern.

2. The method of claim 1, wherein forming the stress buffer layer is performed by a selective oxidation process capable of preventing oxidation of the tungsten layer.

3. The method of claim 2, wherein the selective oxidation process is performed in an atmosphere of a mixture of $H_2O$ and $H_2$ and at a temperature ranging from approximately 600° C. to approximately 800° C.

4. The method of claim 2, wherein the selective oxidation process comprises a plasma oxidation process.

5. The method of claim 4, wherein the plasma oxidation process is performed in an atmosphere of $O_2$ plasma and at a temperature ranging from approximately 200° C. to approximately 600° C.

6. The method of claim 1, wherein the hard mask pattern and the capping layer comprise a silicon nitride layer.

7. The method of claim 1, wherein the stacked layer and the hard mask pattern are used as a gate line, a bit line, or a metal line.

8. A method for fabricating a semiconductor device, the method comprising, sequentially:
    forming a stacked layer including a tungsten layer;
    forming a hard mask layer over the stacked layer;
    etching a portion of the hard mask layer, thereby forming a hard mask pattern including a hard mask pattern portion and a hard mask layer portion;
    forming a stress buffer layer over the hard mask pattern by oxidizing a surface of the hard mask pattern;
    removing the hard mask layer portion, a portion of the stress buffer layer formed on the hard mask layer portion and a portion of the stacked layer in order to remove a portion of the tungsten layer by using a remaining stress buffer layer and the hard mask pattern portion as an etch mask, thereby forming a first resultant structure;
    forming a capping layer over the first resultant structure, wherein the stress buffer layer is formed between the hard mask pattern and the capping layer to inhibit transfer of stress from the hard mask pattern to the capping layer during a subsequent thermal process so as to inhibit leaning of the capping layer;
    etching the capping layer to retain the capping layer on sidewalls of the first resultant structure; and
    removing the remaining portion of the stacked layer uncovered by the hard mask pattern portion.

9. The method of claim 8, wherein the stress buffer layer comprises an oxide layer.

10. The method of claim 9, wherein the oxide layer is formed by an atomic layer deposition (ALD) process.

11. The method of claim 8, wherein the hard mask pattern and the capping layer comprise a nitride layer.

12. The method of claim 8, wherein the stacked layer and the hard mask pattern are used as a gate line, a bit line, or a metal line.

* * * * *